United States Patent
Ma

(10) Patent No.: US 10,192,487 B2
(45) Date of Patent: Jan. 29, 2019

(54) PIXEL CIRCUIT HAVING THRESHOLD VOLTAGE COMPENSATION, DRIVING METHOD THEREOF, ORGANIC ELECTROLUMINESCENT DISPLAY PANEL, AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/520,210

(22) PCT Filed: Sep. 30, 2016

(86) PCT No.: PCT/CN2016/101108
§ 371 (c)(1),
(2) Date: Apr. 19, 2017

(87) PCT Pub. No.: WO2017/118124
PCT Pub. Date: Jul. 13, 2017

(65) Prior Publication Data
US 2018/0090071 A1 Mar. 29, 2018

(30) Foreign Application Priority Data
Jan. 6, 2016 (CN) .......................... 2016 1 0007246

(51) Int. Cl.
*G09G 3/30* (2006.01)
*G09G 3/3258* (2016.01)
(Continued)

(52) U.S. Cl.
CPC ......... *G09G 3/3258* (2013.01); *G09G 3/3233* (2013.01); *H01L 51/5036* (2013.01);
(Continued)

(58) Field of Classification Search
CPC ............ G09G 3/12–3/14; G09G 3/30–3/3291
See application file for complete search history.

(56) References Cited

U.S. PATENT DOCUMENTS

2010/0060560 A1  3/2010  Sambandan
2012/0161637 A1*  6/2012  Lee .......................... G09G 3/32
                                                            315/122
(Continued)

FOREIGN PATENT DOCUMENTS

CN       103325810 A     9/2013
CN       103839520 A     6/2014
(Continued)

OTHER PUBLICATIONS

International Search Report dated Nov. 30, 2016.
Chinese Office Action in CN201610007246.0, dated Jul. 10, 2017.

*Primary Examiner* — Sanghyuk Park
(74) *Attorney, Agent, or Firm* — Dilworth & Barrese, LLP.; Michael J. Musella, Esq.

(57) ABSTRACT

A pixel circuit, a driving method, an organic electroluminescent display panel, and a display device, the pixel circuit includes a light emitting element, a driving control module, a resetting control module, a charging control module, a writing control module, and a light emitting control module; the resetting control module resets the first node and the light emitting element; the charging control module charges the second node through the light emitting control module and discharges the second node through the driving control module and the resetting control module; the writing control module writes a data signal to the second node; and the light emitting control module controls the driving control module to drive the light emitting element to emit light.

18 Claims, 9 Drawing Sheets

(51) Int. Cl.
*G09G 3/3233* (2016.01)
*H01L 51/50* (2006.01)
*H01L 51/52* (2006.01)

(52) U.S. Cl.
CPC . *H01L 51/5203* (2013.01); *G09G 2300/0814* (2013.01); *G09G 2300/0819* (2013.01); *G09G 2300/0842* (2013.01); *G09G 2300/0861* (2013.01); *G09G 2300/0866* (2013.01); *G09G 2320/045* (2013.01)

(56) References Cited

U.S. PATENT DOCUMENTS

2015/0002560 A1    1/2015   Kwon et al.
2016/0155387 A1*   6/2016   Kim ................... G09G 3/3291
                                                               345/76

FOREIGN PATENT DOCUMENTS

| CN | 103985352 A | 8/2014 |
| CN | 104050917 A | 9/2014 |
| CN | 104167177 A | 11/2014 |
| CN | 104916257 A | 9/2015 |
| CN | 105185305 A | 12/2015 |
| CN | 105427800 A | 3/2016 |
| KR | 100673759 B1 | 3/2006 |

* cited by examiner

PIXEL CIRCUIT HAVING THRESHOLD VOLTAGE COMPENSATION, DRIVING METHOD THEREOF, ORGANIC ELECTROLUMINESCENT DISPLAY PANEL, AND DISPLAY DEVICE

TECHNICAL FIELD

The present disclosure relates to the field of display technique, and more particularly to a pixel circuit, a driving method, an organic electroluminescent display panel, and a display device.

BACKGROUND

OLED (Organic Electroluminescent Display) is one of the hotspots in today's Flat Panel Display field. Compared with LCD (liquid crystal display), OLED has advantages such as low consumption, low production cost, self-luminescence, wide viewing angle, fast responding speed and so on.

Unlike using a stable voltage to control brightness of the LCD, OLED is current-driven and it is required a stable current to control light emitting. There is ununiformity in the Threshold voltages $V_{th}$ of the driving transistors in the pixel circuits of OLED due to manufacturing process and device aging, so that the current flowing through OLED element at each pixel dot varies, which results in ununiformity in the display brightness, thereby affecting the display effect of the whole image.

For example, in a 2T1C pixel circuit, as illustrated in FIG. 1, the circuit comprises one driving transistor T2, one switching transistor T1, and one storage capacitor Cs. When a scan line Scan selects a row, a low level signal is inputted from the scan line; the P-type switching transistor T1 is turned on and the voltage at the data line Data is written into the storage capacitor Cs. When the scanning of this row ends, the signal inputted from the scan line Scan becomes a high level, so that the P-type switching transistor T1 is turned off, and a gate voltage stored in the storage capacitor Cs causes the driving transistor T2 to generate a current to drive OLED, thus ensuring consecutive light emitting of OLED element within one frame. The formula of the saturation current of the driving transistor T2 is $I_{OLED}=K(V_{GS}-V_{th})^2$. As stated above, the threshold voltage $V_{th}$ of the driving transistor T2 would drift due to the manufacturing process and device aging, so that the current flowing through OLED element at each pixel dot varies as the threshold voltage $V_{th}$ of the driving transistor T2 varies, which results in the ununiformity in the image brightness.

In view of the above, in a known compensation method, the threshold voltage is written by discharging the driving transistor, so that the current flowing through OLED element at each pixel dot is independent of the threshold voltage $V_{th}$ of the driving transistor. However, the OLED element exists in the discharge path of the driving transistor, and thus not only the characteristics and display lifespan of OLED, but also the accuracy of the written threshold voltage $V_{th}$ of the driving transistor would be affected, thus worsening the compensation effect, and affecting the displaying of the whole image.

SUMMARY

In view of the above, embodiments of the present disclosure provide a pixel circuit, a driving method, an organic electroluminescent display panel, and a display device, which can ensure the accuracy of the written threshold voltage $V_{th}$ of the driving transistor.

Accordingly, an embodiment of the present disclosure provides a pixel circuit, comprising a light emitting element, a driving control module, a resetting control module, a charging control module, a writing control module, and a light emitting control module, wherein:

a first control terminal and a second control terminal of the resetting control module are both connected to a reset signal terminal, an input terminal of the resetting control module is connected to a first level signal terminal, a first output terminal of the resetting control module is connected to a first node, and a second output terminal of the resetting control module is connected to an output terminal of the driving control module and an input terminal of the light emitting element; the resetting control module is configured to reset the first node and the light emitting element;

a control terminal of the charging control module is connected to the reset signal terminal, an input terminal of the charging control module is connected to an output terminal of the light emitting control module and a first input terminal of the driving control module, and an output terminal of the charging control module is connected to a second node; the charging control module is configured to charge the second node through the light emitting control module and discharge the second node through the driving control module and the resetting control module;

a control terminal of the writing control module is connected to a scan signal terminal, an input terminal of the writing control module is connected to a data signal terminal, and an output terminal of the writing control module is connected to the second node; the writing control module is configured to write a data signal to the second node;

a control terminal of the light emitting control module is connected to a light emitting signal terminal, and an input terminal of the light emitting control module is connected to a second level signal terminal; the light emitting control module is configured to control the driving control module to drive the light emitting element to emit light;

a second input terminal of the driving control module is connected to the first node, and a third input terminal of the driving control module is connected to the second node; and an output terminal of the light emitting element is connected to a third level signal terminal.

In an optional implementation, in the pixel circuit provided above in the embodiment of the present disclosure, the driving control module comprises a driving transistor and a first capacitor;

a gate of the driving transistor is connected to the first node, a first electrode of the driving transistor is connected to the input terminal of the charging control module and the output terminal of the light emitting control module, a second electrode of the driving transistor is connected to the input terminal of the light emitting element and the second output terminal of the resetting control module; and the first capacitor is connected between the first node and the second node.

In an optional implementation, in the pixel circuit provided above in the embodiment of the present disclosure, the driving control module further comprises a second capacitor;

one terminal of the second capacitor is connected to the second node and the other terminal of the second capacitor is connected to the second level signal terminal.

In an optional implementation, in the pixel circuit provided above in the embodiment of the present disclosure, the resetting control module comprises a first switching transistor and a second switching transistor;

a gate of the first switching transistor is connected to the reset signal terminal, a first electrode of the first switching transistor is connected to the first level signal terminal and a first electrode of the second switching transistor, and a second electrode of the first switching transistor is connected to the first node;

a gate of the second switching transistor is connected to the reset signal terminal, and a second electrode of the second switching transistor is connected to the second electrode of the driving transistor and the input terminal of the light emitting element.

In an optional implementation, in the pixel circuit provided above in the embodiment of the present disclosure, the charging control module comprises a third switching transistor;

a gate of the third switching transistor is connected to the reset signal terminal, a first electrode of the third switching transistor is connected to the first electrode of the driving transistor and the output terminal of the light emitting control module, and a second electrode of the third switching transistor is connected to the second node.

In an optional implementation, in the pixel circuit provided above in the embodiment of the present disclosure, the writing control module comprises a fourth switching transistor;

a gate of the fourth switching transistor is connected to the scan signal terminal, a first electrode of the fourth switching transistor is connected to the data signal terminal, and a second electrode of the fourth switching transistor is connected to the second node.

In an optional implementation, in the pixel circuit provided above in the embodiment of the present disclosure, the light emitting control module comprises a fifth switching transistor;

a gate of the fifth switching transistor is connected to the light emitting signal terminal, a first electrode of the fifth switching transistor is connected to the second level signal terminal, and a second electrode of the fifth switching transistor is connected to the first electrode of the third switching transistor and the first electrode of the driving transistor.

In an optional implementation, in the pixel circuit provided above in the embodiment of the present disclosure, an absolute value of a difference between a first level signal inputted from the first level signal terminal and a third level signal inputted from the third level signal terminal is smaller than a turn-on voltage of the light emitting element.

An embodiment of the present disclosure further provides an organic electroluminescent display panel, comprising the pixel circuit provided above in the embodiment of the present disclosure.

An embodiment of the present disclosure further provides a display device, comprising the organic electroluminescent display panel provided above in the embodiment of the present disclosure.

An embodiment of the present disclosure further provides a driving method for a pixel circuit, comprising:

in a reset period, making the resetting control module in a turned-on status under control of the reset signal terminal, applying the signal at the first level signal terminal to the first node and the light emitting element, resetting the first node and the light emitting element by the signal at the first level signal terminal; making the charging control module in a turned-on status under control of the reset signal terminal, and making the light emitting control module in a turned-on status under control of the light emitting signal terminal; applying the signal at the second level signal terminal to the second node, and charging the second node by the signal at the second level signal terminal;

in a compensation period, making the charging control module in a turned-on status under control of the reset signal terminal, and applying the signal at the second node to the first input terminal of the driving control module; making the resetting control module in a turned-on status under control of the reset signal terminal, and applying the signal at the first level signal terminal to the output terminal of the driving control module; discharging the second node by the signal at the first level signal terminal;

in a writing period, making the writing control module in a turned-on status under control of the scan signal terminal, and applying the data signal at the data signal terminal to the second node, so as to write the data signal at the data signal terminal to the second node; and in a light emitting period, making the light emitting control module in a turned-on status under control of the light emitting signal terminal, applying the signal at the second level signal terminal to the driving control module, and controlling the driving control module to drive the light emitting element to emit light by signal at the second level signal terminal.

The embodiments of the present disclosure provide the pixel circuit, the driving method, the organic electroluminescent display panel, and the display device described above. The pixel circuit comprises a light emitting element, a driving control module, a resetting control module, a charging control module, a writing control module, and a light emitting control module; the resetting control module is configured to reset the first node and the light emitting element; the charging control module is configured to charge the second node through the light emitting control module and to discharge the second node through the driving control module and the resetting control module; the writing control module is configured to write a data signal to the second node; and the light emitting control module is configured to control the driving control module to drive the light emitting element to emit light. Since the charging control module discharges the second node through the driving control module and the resetting control module, the discharge path of the driving control module does not include the light emitting element, so that characteristics and display life of the light emitting element are not affected, ensuring the accuracy of the written threshold voltage of the driving control module, and optimizing the compensation effect.

DETAILED DESCRIPTION OF THE EMBODIMENTS

Hereinafter, implementations of the pixel circuit, the driving method, the organic electroluminescent display panel, and the display device provided in the embodiments of the present disclosure will be described in details in connection with the drawings.

Figure 1:
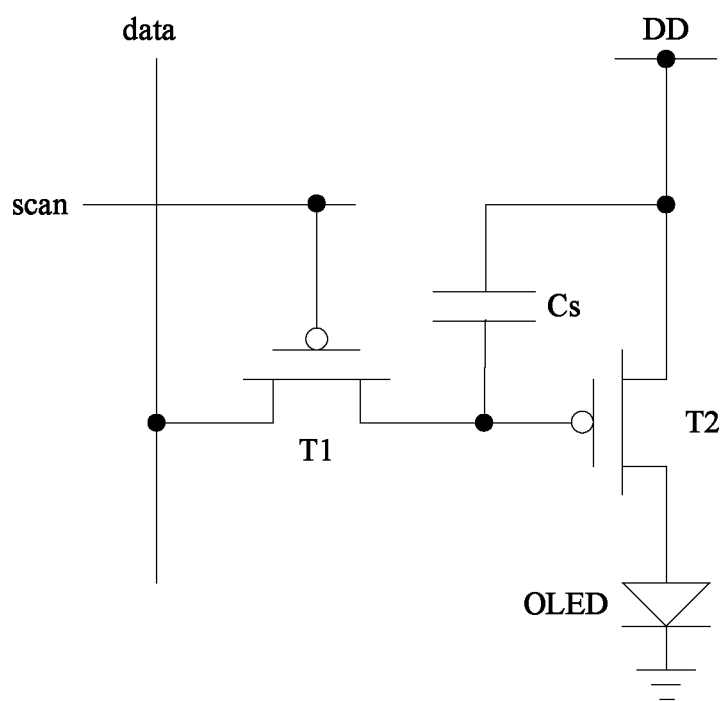
FIG. 1 is a schematic diagram of a configuration of a known 2T1C pixel circuit.
Figure 2:
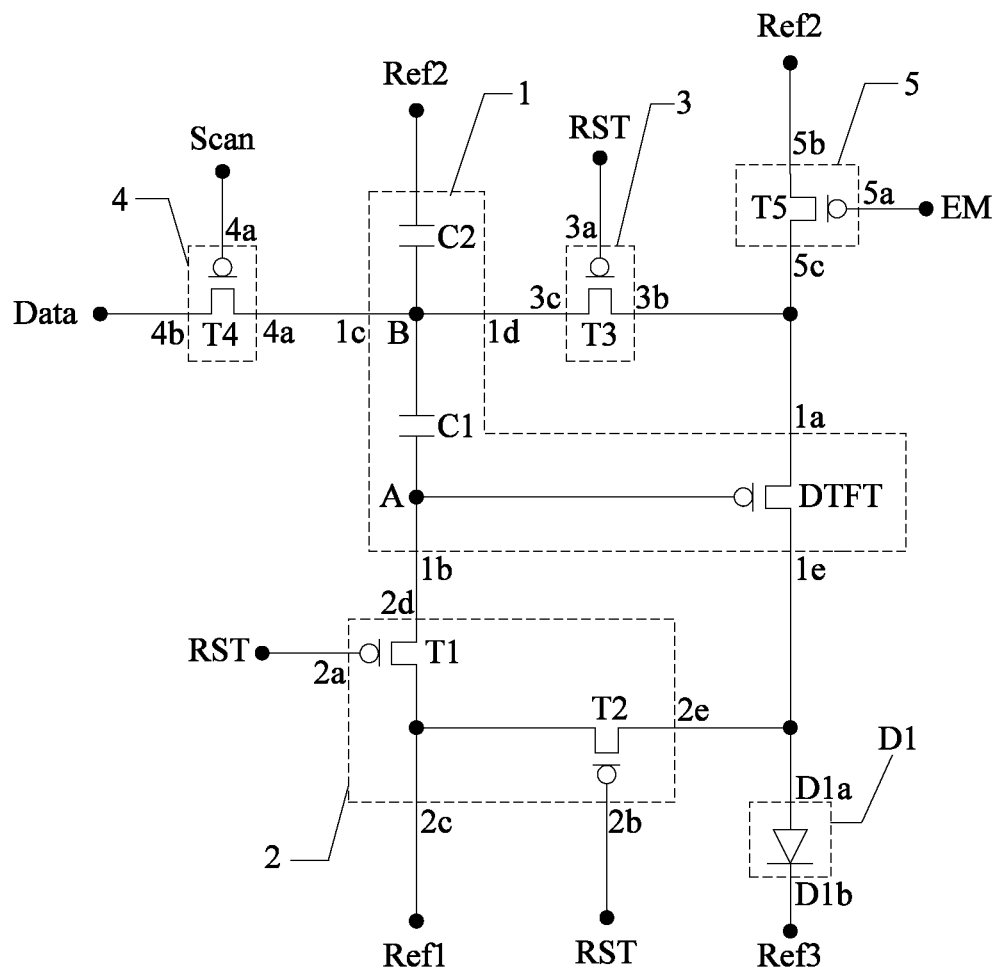
FIG. 2 is a schematic diagram of a configuration of a pixel circuit provided in an embodiment of the present disclosure.

A pixel circuit provided in an embodiment of the present disclosure, as illustrated in FIG. 2, comprises a light emitting element D1, a driving control module 1, a resetting control module 2, a charging control module 3, a writing control module 4, and a light emitting control module 5, wherein:

a first control terminal 2a and a second control terminal 2b of the resetting control module 2 are connected to a reset signal terminal RST, an input terminal 2c of the resetting control module 2 is connected to a first level signal terminal Ref1, a first output terminal 2d of the resetting control module 2 is connected to a first node A, and a second output terminal 2e of the resetting control module 2 is connected to an output terminal 1e of the driving control module 1 and an input terminal D1a of the light emitting element D1; the resetting control module 2 is configured to reset the first node A and the light emitting element D1;

a control terminal 3a of the charging control module 3 is connected to the reset signal terminal RST, an input terminal 3b of the charging control module 3 is connected to an output terminal 5c of the light emitting control module 5 and a first input terminal 1a of the driving control module 1, and an output terminal 3c of the charging control module 3 is connected to a second node B; the charging control module 3 is configured to charge the second node B through the light emitting control module 5 and discharge the second node B through the driving control module 1 and the resetting control module 2;

a control terminal 4a of the writing control module 4 is connected to a scan signal terminal Scan, an input terminal 4b of the writing control module 4 is connected to a data signal terminal Data, and an output terminal 4c of the writing control module 4 is connected to the second node B; the writing control module 4 is configured to write a data signal to the second node B;

a control terminal 5a of the light emitting control module 5 is connected to a light emitting signal terminal EM, and an input terminal 5b of the light emitting control module 5 is connected to a second level signal terminal Ref2; the light emitting control module 5 is configured to control the driving control module 1 to drive the light emitting element D1 to emit light;

a second input terminal 1b of the driving control module 1 is connected to the first node A, and a third input terminal 1c and a fourth input terminal 1d of the driving control module 1 are connected to the second node B; and an output terminal D1b of the light emitting element D1 is connected to a third level signal terminal Ref3.

The pixel circuit provided in the embodiment of the present disclosure comprises the light emitting element, the driving control module, the resetting control module, the charging control module, the writing control module, and the light emitting control module; the resetting control module is configured to reset the first node and the light emitting element; the charging control module is configured to charge the second node through the light emitting control module and discharge the second node through the driving control module and the resetting control module; the writing control module is configured to write a data signal to the second node; and the light emitting control module is configured to control the driving control module to drive the light emitting element to emit light. Since the charging control module is configured to discharge the second node through the driving control module and the resetting control module, the discharge path of the driving control module does not include the light emitting element, so that, not only characteristics and display life of the light emitting element would not be affected, but also the accuracy in the writing of the threshold voltage of the driving control module can be ensured, and thus the compensation effect can be optimized.

In a specific implementation, in the pixel circuit provided above in the embodiment of the present disclosure, in a reset period, the resetting control module 2 is in a turned-on status under control of the reset signal terminal RST, a signal at the first level signal terminal Ref1 is connected to the first node A and the light emitting element D1, and the first node A and the light emitting element D1 are reset by the first level signal terminal Ref1; the charging control module 3 is in a turned-on status under control of the reset signal terminal RST, and the light emitting control module 5 is in a turned-on status under control of the light emitting signal terminal EM, so that a signal at the second level signal terminal Ref2 is connected to the second node B to charge the second node B; in a compensation period, the charging control module 3 is in a turned-on status under control of the reset signal terminal RST, so that the signal at the second node B is connected to the first input terminal 1a of the driving control module 1; the resetting control module 2 is in a turned-on status under control of the reset signal terminal RST, and the signal at the first level signal terminal Ref1 is applied to the output terminal 1e of the driving control module 1, so that the second node B is discharged by the first level signal terminal Ref1; in a writing period, the writing control module 4 is in a turned-on status under control of the scan signal terminal Scan, so that a signal at the data signal terminal Data is connected to the second node B, and the data signal is written to the second node B by the data signal terminal Data; and in a light emitting period, the light emitting control module 5 is in a turned-on status under control of the light emitting signal terminal EM, so that the signal at the second level signal terminal Ref2 is applied to the driving control module 1, and the driving control module 1 is controlled by the second level signal terminal Ref2 to drive the light emitting element D1 to emit light.

In a specific implementation, in the pixel circuit provided above in the embodiment of the present disclosure, as illustrated in FIG. 2, the driving control module 1 can comprise a driving transistor DTFT and a first capacitor C1; a gate of the driving transistor DTFT is connected to the first node A, a first electrode of the driving transistor DTFT is connected to the input terminal 3b of the charging control module 3 and the output terminal 5c of the light emitting control module 5, a second electrode of the driving transistor DTFT is connected to the input terminal D1a of the light emitting element D1 and the second output terminal 2e of the resetting control module 2; and the first capacitor C1 is connected between the first node A and the second node B.

In a specific implementation, the light emitting element D1 in the pixel circuit provided above in the embodiment of the present disclosure is an organic light emitting diode (OLED) in general. The light emitting element D1 emits light and achieves the display under an effect of a saturation current of the driving transistor DTFT. The driving transistor DTFT that drives the light emitting element D1 to emit light can be an N-type transistor or a P-type transistor, and the present disclosure make no limitation thereto.

In a specification implementation, in the pixel circuit provided above in the embodiment of the present disclosure, voltage at the first level signal terminal Ref1 is usually a negative voltage, and voltage at the second level signal terminal Ref2 is usually a positive voltage.

Optionally, in the pixel circuit provided above in the embodiment of the present disclosure, the driving control module 1 can further comprise a second capacitor C2; one terminal of the second capacitor C2 is connected to the second node B and the other terminal of the second capacitor C2 is connected to the second level signal terminal Ref2. In this way, a potential at the second node B can be kept by the second capacitor C2 and the second level signal terminal Ref2, and a potential at the first node A can be indirectly kept by the second node B and the first capacitor C1.

In a specific implementation, in the pixel circuit provided above in the embodiment of the present disclosure, as illustrated in FIG. 2, the resetting control module 2 can comprise a first switching transistor T1 and a second switching transistor T2; a gate of the first switching transistor T1 is connected to the reset signal terminal RST, a first electrode of the first switching transistor T1 is connected to the first level signal terminal Ref1 and a first electrode of the second switching transistor T2, and a second electrode of the first switching transistor T1 is connected to the first node A; a gate of the second switching transistor T2 is connected to the reset signal terminal RST, and a second electrode of the second switching transistor T2 is connected to the second electrode of the driving transistor DTFT and the input terminal D1a of the light emitting element D1.

In a specific implementation, the first switching transistor T1 and the second switching transistor T2 can be N-type transistors; as an alternative, the first switching transistor T1 and the second switching transistor T2 can be P-type transistors, and the present disclosure makes no limitation thereto. In a case in which the first switching transistor T1 and the second switching transistor T2 are N-type transistors, the first switching transistor T1 and the second switching transistor T2 are in a turned-on status when a signal at the reset signal terminal RST is at a high level; in a case in which the first switching transistor T1 and the second switching transistor T2 are P-type transistors, the first switching transistor T1 and the second switching transistor T2 are in a turned-on status when a signal at the reset signal terminal RST is at a low level.

In the pixel circuit provided in the embodiment of the present disclosure, in a case in which the resetting control module 2 adopts the first switching transistor T1 and the second switching transistor T2, the operating principles of the resetting control module 2 are provided as below. In the reset period, the first switching transistor T1 and the second switching transistor T2 are in a turned-on status under control of the reset signal terminal RST, the signal at the first level signal terminal Ref1 is connected to the first node A and the light emitting element D1, and the signal at the first level signal terminal Ref1 resets the first node A and the light emitting element D1, so that a potential at the first node A and a potential at an anode of the light emitting element D1 are both at $V_{ref1}$; in this case, the driving transistor DTFT in a turned-on status, the charging control module 3 is in a turned-on status under control of the reset signal terminal RST, and the light emitting control module 5 is in a turned-on status under control of the light emitting signal terminal EM, so that a signal at the second level signal terminal Ref2 is connected to the second node B, and the signal at the second level signal terminal Ref2 charges the second node B, making a potential at the second node B be at $V_{ref2}$. In the compensation period, the charging control module 3 is in a turned-on status under control of the reset signal terminal RST, so that the signal at the second node B is connected to the first input terminal 1a of the driving control module 1, i.e., the first electrode of the driving transistor DTFT; the second switching transistor T2 is in a turned-on status under control of the reset signal terminal RST, so that the signal at the first level signal terminal Ref1 is applied to the output terminal 1e of the driving control module, i.e., the second electrode of the driving transistor DTFT, and thus the signal at the first level signal terminal Ref1 discharges the second node B through the second switching transistor T2, the driving transistor DTFT, and the charging control module 3, until the driving transistor DTFT is turned off; in this case, the potential at the second node B is $V_{ref1}-V_{th}$, so that the threshold voltage $V_{th}$ of the driving transistor DTFT is stored across the first capacitor C1. In the writing period and the light emitting period, the first transistor T1 and the second switching transistor T2 are turned off.

In a specific implementation, in the pixel circuit provided above in the embodiment of the present disclosure, as illustrated in FIG. 2, the charging control module 3 can comprise a third switching transistor T3; a gate of the third switching transistor T3 is connected to the reset signal terminal RST, a first electrode of the third switching transistor T3 is connected to the first electrode of the driving transistor DTFT and the output terminal 5c of the light emitting control module 5, and a second electrode of the third switching transistor T3 is connected to the second node B.

In a specific implementation, the third switching transistor T3 can be an N-type transistor or a P-type transistor, and the present disclosure makes no limitation thereto. In a case in which the third switching transistor T3 is an N-type transistor, the third switching transistor T3 is in a turned-on status when a signal at the reset signal terminal RST is at a high level; in a case in which the third switching transistor T3 is a P-type transistor, the third switching transistor T3 is in a turned-on status when a signal at the reset signal terminal RST is at a low level.

In the pixel circuit provided in the embodiment of the present disclosure, in a case in which the charging control module 3 adopts the third switching transistor T3, its operating principles are provided as below. In the reset period, the third switching transistor T3 is in a turned-on status under control of the reset signal terminal RST, and the light emitting control module 5 is in a turned-on status under control of the light emitting signal terminal EM, so that a signal at the second level signal terminal Ref2 is connected to the second node B, and the signal at the second level signal terminal Ref2 charges the second node B through the light emitting control module 5 and the third switching transistor T3, causing the potential at the second node B to be at $V_{ref2}$. In the compensation period, the third switching transistor T3 is in a turned-on status under control of the reset signal terminal RST, so that a signal at the second node B is connected to the first input terminal 1a of the driving control module 1, i.e., the first electrode of the driving transistor DTFT; the second switching transistor T2 is in a turned-on status under control of the reset signal terminal RST, so that the signal at the first level signal terminal Ref1 is applied to the output terminal 1e of the driving control module, i.e., the second electrode of the driving transistor DTFT, and thus the signal at the first level signal terminal Ref1 discharges the second node B through the second switching transistor T2, the driving transistor DTFT, and the third switching transistor T3, until the driving transistor DTFT is turned off; in this case, the potential at the second node B is $V_{ref1}-V_{th}$, and threshold voltage $V_{th}$ of the driving transistor DTFT is stored across the first capacitor C1. In the writing period and the light emitting period, the third switching transistor T3 is turned off.

In a specific implementation, in the pixel circuit provided above in the embodiment of the present disclosure, as illustrated in FIG. 2, the writing control module 4 can comprise a fourth switching transistor T4; a gate of the fourth switching transistor T4 is connected to the scan signal terminal Scan, a first electrode of the fourth switching transistor T4 is connected to the data signal terminal Data, and a second electrode of the fourth switching transistor T4 is connected to the second node B.

In a specific implementation, the fourth switching transistor T4 can be an N-type transistor or a P-type transistor, and the present disclosure makes no limitation thereto. In a case in which the fourth switching transistor T4 is an N-type transistor, the fourth switching transistor T4 is in a turned-on status when a signal at the scan signal terminal Scan is at a high level; in a case in which the fourth switching transistor T4 is a P-type transistor, the fourth switching transistor T4 is in a turned-on status at the signal from the scan signal terminal Scan is at a low level.

In the pixel circuit provided in the embodiment of the present disclosure, in a case in which the writing control module 4 adopts the fourth switching transistor T4, its operating principles are provided as below. In the reset period and the compensation period, the fourth switching transistor T4 is turned off. In the writing period, the fourth switching transistor T4 is turned on under control of the scan signal terminal Scan, a data signal at the data signal terminal Data is connected to the second node B, so that the data signal is written to the second node B; in this case, the potential at the second node B jumps to $V_{data}$ from $V_{ref1}-V_{th}$, that is, the potential at the second node B jumps to be the same as the potential at the data signal terminal Data; since the potential at the node A of the first capacitor C1 before the jumping is $V_{ref1}$, the electric quantity in the first capacitor C1 before the jumping is $(V_{ref1}-V_{th}-V_{ref1})$ C1; it is assumed that the potential at the node A of the first capacitor C1 after the jumping is X, and then the electric quantity of the first capacitor C1 after the jumping is $(V_{data}-X)$ C1. From the charge conservation principle, $(V_{ref1}-V_{th}-V_{ref1})$ C1=$(V_{data}-X)$ C1, it can be deduced $X=V_{data}+V_{th}$, that is, the potential at the first node A of the first capacitor C1 after the jumping is $V_{data}+V_{th}$. In the light emitting period, the fourth switching transistor T4 is turned off.

In a specific implementation, in the pixel circuit provided above in the embodiment of the present disclosure, as illustrated in FIG. 2, the light emitting control module 5 can comprise a fifth switching transistor T5; a gate of the fifth switching transistor T5 is connected to the light emitting signal terminal EM, a first electrode of the fifth switching transistor T5 is connected to the second level signal terminal Ref2, and a second electrode of the fifth switching transistor T5 is connected to the first electrode of the third switching transistor T3 and the first electrode of the driving transistor DTFT.

In a specific implementation, the fifth switching transistor T5 can be an N-type transistor or a P-type transistor, and the present disclosure makes no limitation thereto. In a case in which the fifth switching transistor T5 is an N-type transistor, the fifth switching transistor T5 is in a turned-on status when a signal at the light emitting signal terminal EM is at a high level; in a case in which the fifth switching transistor T5 is a P-type transistor, the fifth switching transistor T5 is in a turned-on status when the signal at light emitting signal terminal EM is at a low level.

In the pixel circuit provided in the embodiment of the present disclosure, in a case in which the light emitting control module 5 adopts the fifth switching transistor T5, its operating principles are provided as below. In the reset period, the third switching transistor T3 is in a turned-on status under control of the reset signal terminal RST, and the fifth switching transistor T5 is in a turned-on status under control of the light emitting signal terminal EM, so that a signal at the second level signal terminal Ref2 is connected to the second node B, and the signal at the second level signal terminal Ref2 charges the second node B through the fifth switching transistor T5 and the third switching transistor T3, causing the potential at the second node B to be Vref2. In the compensation period and the writing period, the fifth switching transistor T5 is turned off. In the light emitting period, the fifth switching transistor T5 is in a turned-on status under control of the light emitting signal terminal EM, and a current, which passes through the fifth switching transistor T5 and the driving transistor DTFT, drives the light emitting element D1 to emit light; in this case, the transistor DTFT is in a saturation status, from the saturation current formula of the driving transistor DTFT, $$I_{OLED} = \frac{1}{2}K(V_{gs}-V_{th})^2 = \frac{1}{2}K(V_{data}+V_{th}-V_{ref2}-V_{th})^2 = \frac{1}{2}K(V_{data}-V_{ref2})^2,$$

$$\text{where } K = \frac{W}{L}C\mu, \frac{W}{L}$$

represents a width-length ratio of the driving transistor DTFT, C represents channel capacitance of the driving transistor DTFT, $\mu$ represents channel mobility of the driving transistor DTFT, it can be seen that an operating current $I_{OLED}$ of the light emitting element D1 is independent of the threshold voltage $V_{th}$ of the driving transistor, and it only depends on the data signal voltage $V_{data}$ inputted from the data signal terminal Data and the voltage $V_{ref2}$ of the second level signal inputted from the second level signal terminal, eliminating the effect of the drift in the threshold voltage $V_{th}$ of the driving transistor DTFT on the operating current $I_{OLED}$ of the light emitting element D1 due to the manufacturing process and a long-term operation, thereby ensuring the normal operation of the light emitting element D1.

Optionally, in the pixel circuit provided in the embodiment of the present disclosure, an absolute value of a difference between a first level signal inputted from the first level signal terminal Ref1 and a third level signal inputted from the third level signal terminal Ref3 can be set smaller than a turn-on voltage of the light emitting element. In this way, the light emitting element D1 can be ensured in the turned-off status in the reset period and the writing period, and accordingly, it is ensured that the potential at the anode of the light emitting element D1 would not be affected by the characteristic status thereof, and thereby the accuracy of the written threshold voltage $V_{th}$ of the driving transistor DTFT can be ensured, and the compensation effect can be further optimized.

It needs to be noted that the switching transistors and the driving transistor mentioned above in the embodiments of the present application can be of TFTs (Thin Film Transistors), can also be MOS (Metal Oxide Semiconductor) transistors, and no limitation is made here. In a specific implementation, the first electrode of each transistor can be a source, the second electrode of each transistor can be a drain; alternatively, the first electrode of each transistor can be a drain, the second electrode of each transistor can be a source, and no limitation is made here. In the description of a specific embodiment, a case in which the driving transistor and the switching transistors are TFTs is taken as an example.

Figure 3:
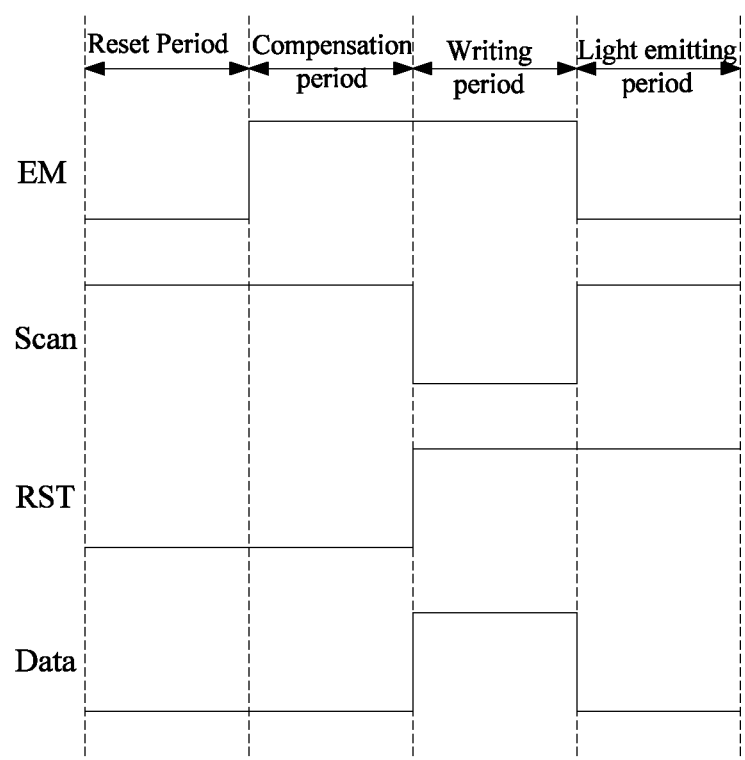
FIG. 3 is a timing diagram of a pixel circuit provided in an embodiment of the present disclosure.

Next, an operation process of the pixel circuit will be described in detail by taking the case in which the driving transistor and the switching transistors in the pixel circuit are P-type transistors as an example. FIG. 3 is a circuit timing diagram corresponding to the pixel circuit illustrated in FIG. 2.

Figure 4:
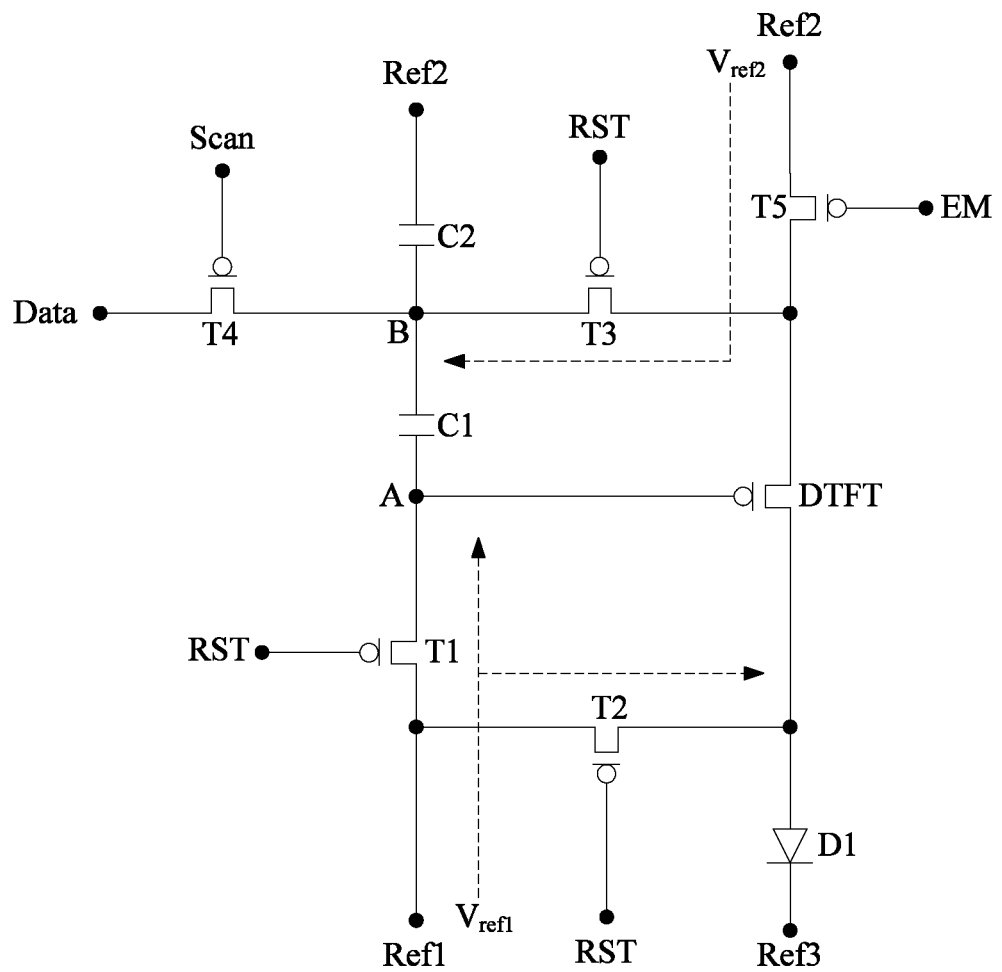
FIGS. 4 to 7 are a schematic diagram of that the pixel circuit provided in an embodiment of the present disclosure in a reset period, a compensation period, a writing period, and a light emitting period, respectively.

First period, i.e., the reset period, is illustrated in FIG. 4; in this period, a high level signal is inputted from the scan signal terminal Scan, so that the fourth switching transistor T4 is turned off; a low level signal is inputted from the reset signal terminal RST and a low level signal is inputted from the light emitting signal terminal EM, so that the first switching transistor T1, the second switching transistor T2, the third switching transistor T3, and the fifth switching transistor T5 are turned on; a signal at the first level signal terminal Ref1 is connected to the first node A through the first switching transistor T1, causing the potential at the first node A to be $V_{ref1}$, a signal at the first level signal terminal Ref1 is connected to the light emitting element D1 through the second switching transistor T2, causing the potential at the anode of the light emitting element D1 to be $V_{ref1}$; a signal at the second level signal terminal Ref2 is connected to the second node B through the fifth switching transistor T5 and the third switching transistor T3, causing the potential at the second node B to be $V_{ref2}$.

Figure 5:
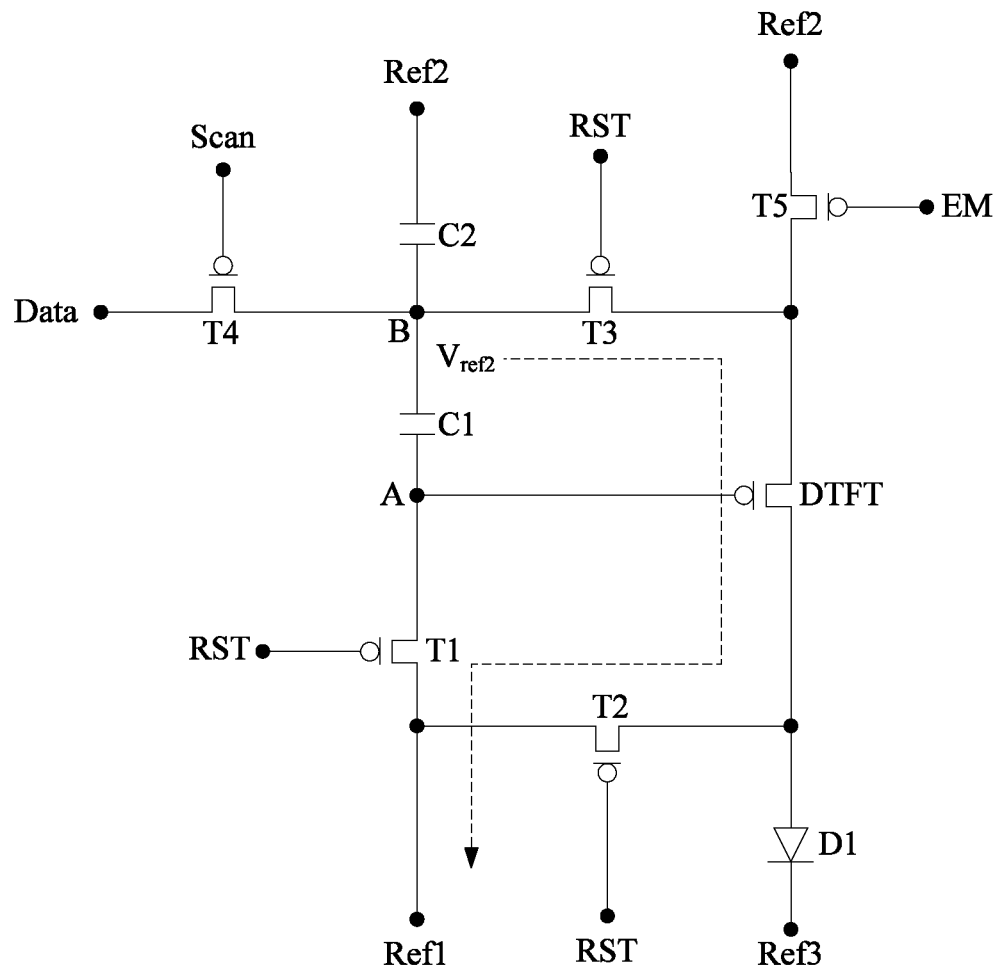

Second period, i.e., the compensation period, is illustrated in FIG. 5; in this period, a high level signal is inputted from the scan signal terminal Scan and a high level signal is inputted from the light emitting signal terminal EM, so that the fourth switching transistor T4 and the fifth switching transistor T5 are turned off; a low level signal is inputted from the reset signal terminal RST, the first switching transistor T1, the second switching transistor T2, and the third switching transistor T3 are turned on, so that a signal at the first level signal terminal Ref1 is connected to the second node B through the second switching transistor T2, the driving transistor DTFT, and the third switching transistor T3, so as to discharge the second node B, and the potential of the node B becomes $V_{ref1}-V_{th}$; and the threshold voltage $V_{th}$ of the driving transistor DTFT is stored in the first capacitor C1.

Figure 6:
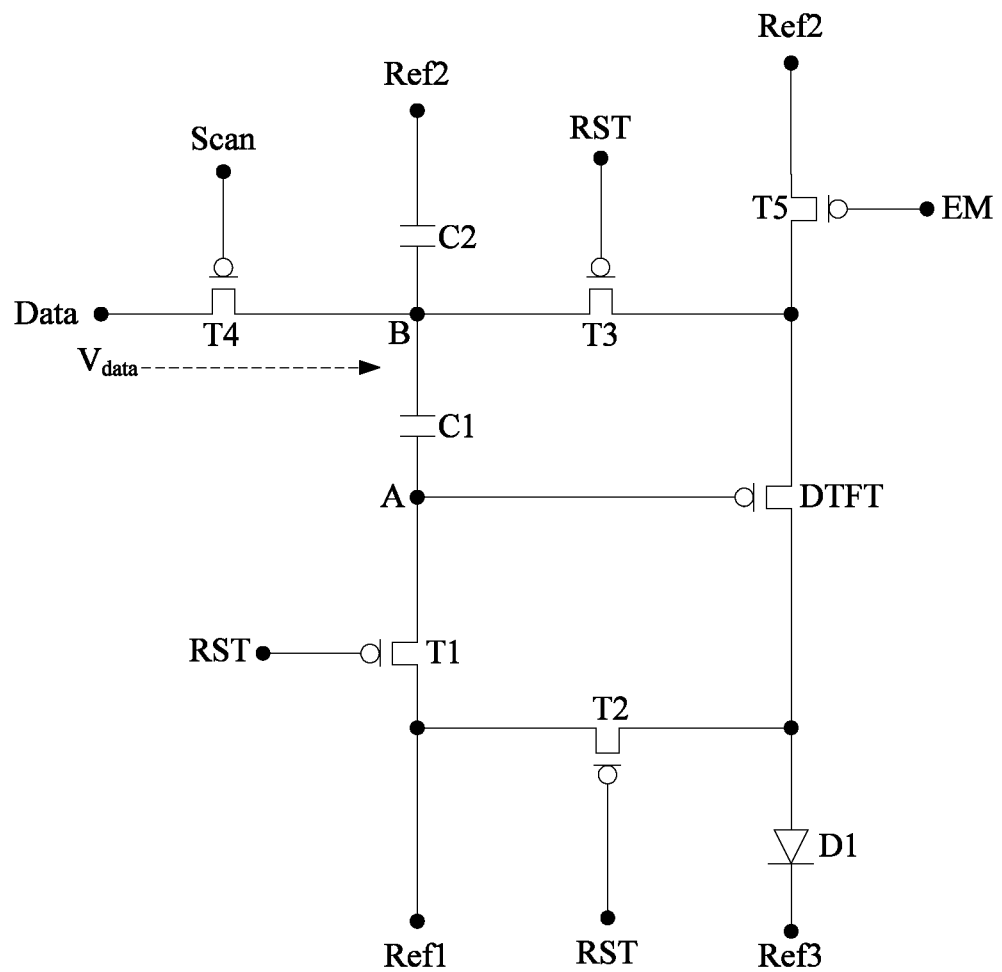

Third period, i.e., the writing period, is illustrated in FIG. 6; in this period, a high level signal is inputted from the reset signal terminal RST and a high level signal is inputted from the light emitting signal terminal EM, the first switching transistor T1, the second switching transistor T2, the third switching transistor T3, and the fifth switching transistor T5 are turned off; a low level signal is inputted from the scanning signal terminal Scan, and the fourth switching transistor T4 is turned on, so that a data signal at the data signal terminal Data is connected to the second node B through the fourth switching transistor T4, and the data signal is written to the second node B; the potential at the second node B jumps to $V_{data}$ from $V_{ref1}-V_{th}$, from the charge conservation principle of the capacitor, the potential at the first node A jumps to $V_{data}+V_{th}$ accordingly.

Figure 7:
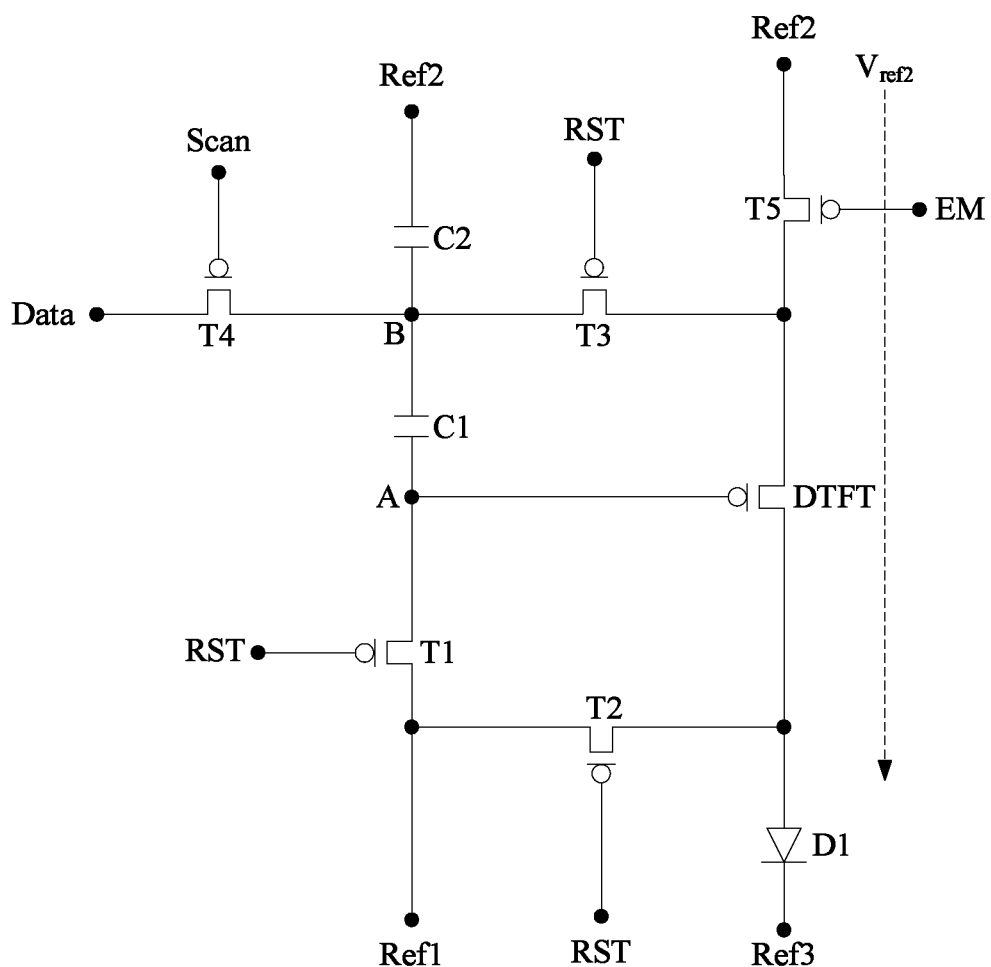

Fourth period, i.e., the light emitting period, is illustrated in FIG. 7; in this period, a high level signal is inputted from the reset signal terminal RST and a high level signal is inputted from the scanning signal terminal Scan, and the first switching transistor T1, the second switching transistor T2, the third switching transistor T3, and the fourth switching transistor T4 are turned off; a low level signal is inputted from the light emitting signal terminal EM, and the fifth switching transistor T5 is turned on; a current signal, after passing through the fifth switching transistor T5 and the driving transistor DTFT, drives the light emitting element D1 to emit light, and a potential at the second node B can be stored by the second capacitor C2 and the second level signal terminal Ref2, and a potential at the first node A is indirectly stored by the second node B and the first capacitor C1, thus ensuring that the potential at the first node A is maintained as the same as that during the light emitting period and the writing period, that is, both are $V_{data}+V_{th}$; in this case, the transistor DTFT is in a saturation status, from the saturation current formula of the driving transistor DTFT, $$I_{OLED} = \frac{1}{2}K(V_{gs}-V_{th})^2 = \frac{1}{2}K(V_{data}+V_{th}-V_{ref2}-V_{th})^2 = \frac{1}{2}K(V_{data}-V_{ref2})^2,$$

$$\text{where } K = \frac{W}{L}C\mu, \frac{W}{L}$$

represents a width-length ratio of the driving transistor DTFT, C represents channel capacitance of the driving transistor DTFT, μ represents channel mobility of the driving transistor DTFT, it can be seen that an operating current $I_{OLED}$ of the light emitting element D1 is independent of the threshold voltage $V_{th}$ of the driving transistor, and it only depends on the voltage $V_{data}$ of the data signal inputted from the data signal terminal Data and the voltage $V_{ref2}$ of the second level signal inputted by the second level signal terminal, eliminating the effect of the drift in the threshold voltage $V_{th}$ of the driving transistor DTFT on the operating current $I_{OLED}$ of the light emitting element D1 due to the manufacturing process and a long-term operation, thereby ensuring the normal operation of the light emitting element D1.

Figure 8:
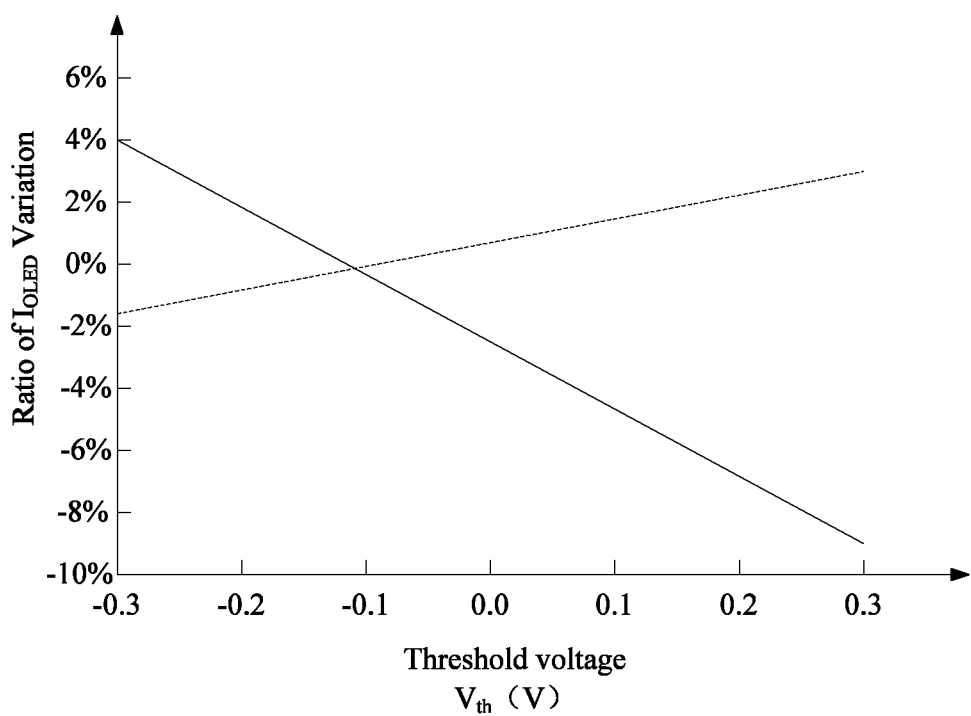
FIG. 8 is a schematic diagram illustrating a case in which $I_{OLED}$ varies as the $V_{th}$ drifts in a high grayscale display and a low grayscale display in a case in which the pixel circuit provided in an embodiment of the present disclosure is applied to an OLED display panel.

FIG. 8 illustrates a case in which the operating current $I_{OLED}$ of the light emitting device D1 varies with the drifting in the threshold voltage $V_{th}$ of the driving transistor DTFT during the high grayscale display (illustrated with dotted line in FIG. 8) and the low grayscale display (illustrated with solid line in FIG. 8) when the pixel circuit provided in the embodiment of the present disclosure is applied to an OLED display panel. As can be seen from FIG. 8, during either one of high grayscale display and low grayscale display, the operating current $I_{OLED}$ of the light emitting device D1 varies very slightly, and the pixel circuit provided in the embodiment of the present disclosure has a good compensation effect.

Figure 9:
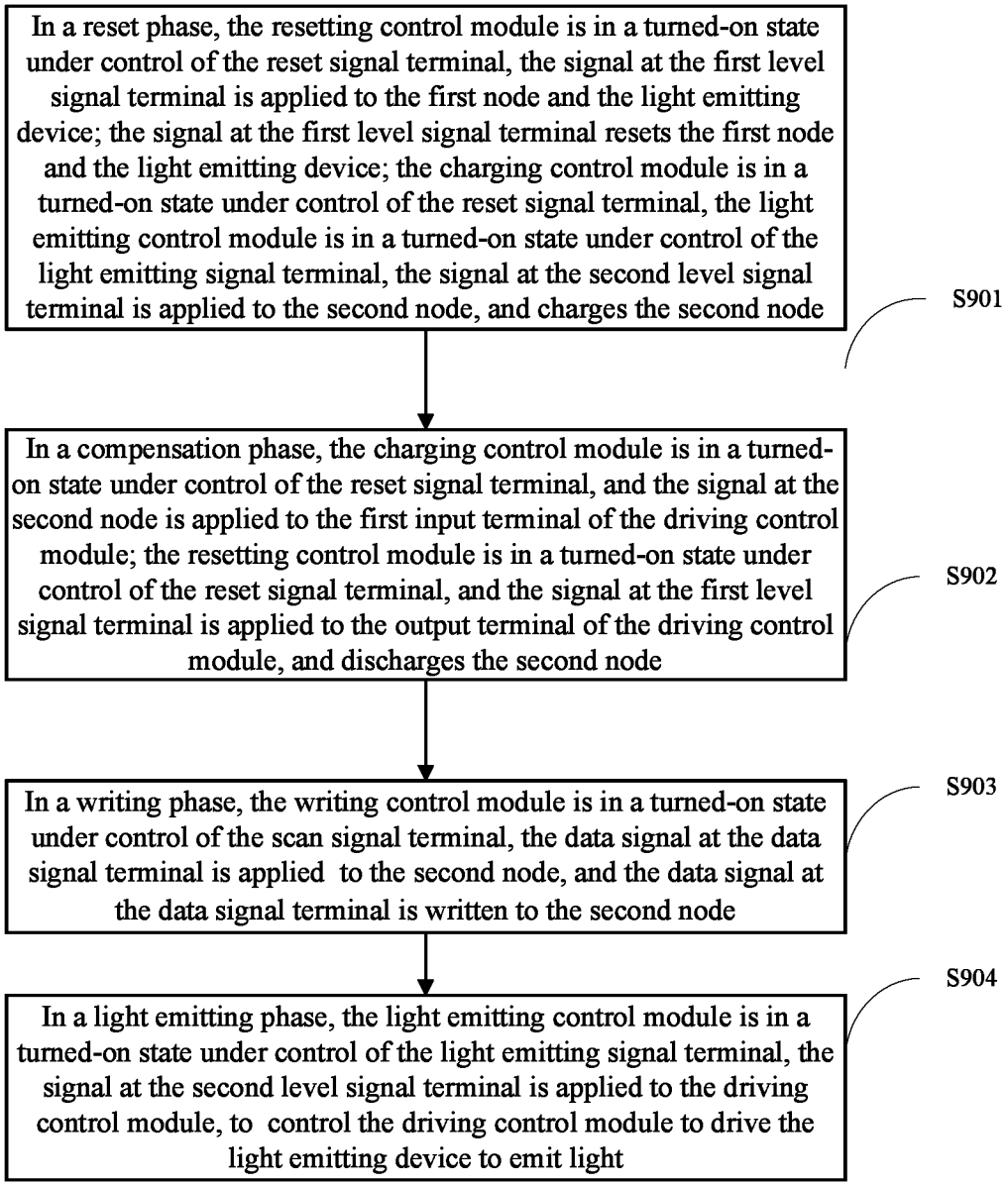
FIG. 9 is a flowchart of a driving method for a pixel circuit provided in an embodiment of the present disclosure.

Regarding the pixel circuit provided in the embodiment of the present disclosure, an embodiment of the present disclosure further provides a driving method for the pixel circuit; as illustrated in FIG. 9, the driving method comprises the following steps:

S901, in a reset period, the resetting control module is in a turned-on status under control of the reset signal terminal, a signal at the first level signal terminal is connected to the first node and the light emitting element, and the signal at the first level signal terminal resets the first node and the light emitting element; the charging control module is in a turned-on status under control of the reset signal terminal, and the light emitting control module is in a turned-on status under control of the light emitting signal terminal, so that a signal at the second level signal terminal is connected to the second node, and the signal at the second level signal terminal charges the second node;

S902, in a compensation period, the charging control module is in a turned-on status under control of the reset signal terminal, and the signal at the second node is connected to the first input terminal of the driving control module; the resetting control module is in a turned-on status under control of the reset signal terminal, so that the signal at the first level signal terminal is applied to the output terminal of the driving control module, and the signal at the first level signal terminal discharges the second node;

S903, in a writing period, the writing control module is in a turned-on status under control of the scan signal terminal, so that a data signal at the data signal terminal is connected to the second node, and the data signal is written to the second node; and S904, in a light emitting period, the light emitting control module is in a turned-on status under control of the light emitting signal terminal, so that the signal at the second level signal terminal is connected to the driving control module, and the signal at the second level signal terminal controls the driving control module to drive the light emitting element to emit light.

Based on the same inventive concept, an embodiment of the present application provides an organic electroluminescent display panel, comprising the pixel circuit provided above in the embodiment of the present disclosure. As for implementations of the organic electroluminescent display panel, reference can be made to the embodiments of the pixel circuit, and details will not be repeated here.

Based on the same inventive concept, an embodiment of the present application further provides a display device, comprising the organic electroluminescent display panel provided above in the embodiment of the present disclosure. The display device can be any product or components having a display function such as a mobile phone, tablet computer, television set, display monitor, notebook computer, digital photo frame, navigator, and so on. As for implementations of the display device, reference can be made to the embodiments of the organic electroluminescent display panel, and details will not be repeated here.

The embodiments of the present disclosure provide the pixel circuit, the driving method, the organic electroluminescent display panel, and the display device described above. The pixel circuit comprises a light emitting element, a driving control module, a resetting control module, a charging control module, a writing control module, and a light emitting control module; the resetting control module is configured to reset the first node and the light emitting element; the charging control module is configured to charge the second node through the light emitting control module and to discharge the second node through the driving control module and the resetting control module; the writing control module is configured to write a data signal to the second node; and the light emitting control module is configured to control the driving control module to drive the light emitting element to emit light. Since the charging control module discharges the second node through the driving control module and the resetting control module, the discharge path of the driving control module does not include the light emitting element, so that characteristics and display life of the light emitting element are not affected, ensuring the accuracy of the written threshold voltage of the driving control module, and optimizing the compensation effect.

Obviously, those skilled in the art can make various modifications and variations to the present disclosure without departing from the spirit and scope thereof. Thus, if these modifications and variations of the present disclosure are within the scope of the claims of the present disclosure as well as their equivalents, the present disclosure is also intended to cover these modifications and variations The present application claims the priority of the Chinese Patent Application No. 201610007246.0 filed on Jan. 6, 2016, the entire disclosure of which is hereby incorporated by reference as part of the present application.

What is claimed is:

1. A pixel circuit, comprising a light emitting element, a driving control module, a resetting control module, a charging control module, a writing control module, and a light emitting control module, wherein:

a first control terminal and a second control terminal of the resetting control module are connected to a reset signal terminal, an input terminal of the resetting control module is connected to a first level signal terminal, a first output terminal of the resetting control module is connected to a first node, and a second output terminal of the resetting control module is connected to an output terminal of the driving control module and an input terminal of the light emitting element; the resetting control module is configured to reset the first node and the light emitting element;

a control terminal of the charging control module is connected to the reset signal terminal, an input terminal of the charging control module is connected to an output terminal of the light emitting control module and a first input terminal of the driving control module, and an output terminal of the charging control module is connected to a second node; the charging control module is configured to charge the second node through the light emitting control module and discharge the second node through the driving control module and the resetting control module;

a control terminal of the writing control module is connected to a scan signal terminal, an input terminal of the writing control module is connected to a data signal terminal, and an output terminal of the writing control module is connected to the second node; the writing control module is configured to write a data signal to the second node;

a control terminal of the light emitting control module is connected to a light emitting signal terminal, and an input terminal of the light emitting control module is connected to a second level signal terminal; the light emitting control module is configured to control the driving control module to drive the light emitting element to emit light;

a second input terminal of the driving control module is connected to the first node, and a third input terminal of the driving control module is connected to the second node; and an output terminal of the light emitting element is connected to a third level signal terminal, wherein the driving control module comprises a driving transistor having a gate connected to the first node, a first electrode connected to the input terminal of the charging control module and the output terminal of the light emitting control module, a second electrode connected to the input terminal of the light emitting element and the second output terminal of the resetting control module without intervention of any transistor.

2. The pixel circuit according to claim 1, wherein the driving control module further comprises a first capacitor connected between the first node and the second node.

3. The pixel circuit according to claim 2, wherein the driving control module further comprises a second capacitor;
one terminal of the second capacitor is connected to the second node and the other terminal of the second capacitor is connected to the second level signal terminal.

4. The pixel circuit according to claim 2, wherein the resetting control module comprises a first switching transistor and a second switching transistor;
a gate of the first switching transistor is connected to the reset signal terminal, a first electrode of the first switching transistor is connected to the first level signal terminal and a first electrode of the second switching transistor, and a second electrode of the first switching transistor is connected to the first node;
a gate of the second switching transistor is connected to the reset signal terminal, and a second electrode of the second switching transistor is connected to the second electrode of the driving transistor and the input terminal of the light emitting element.

5. The pixel circuit according to claim 2, wherein the charging control module comprises a third switching transistor;
a gate of the third switching transistor is connected to the reset signal terminal, a first electrode of the third switching transistor is connected to the first electrode of the driving transistor and the output terminal of the light emitting control module, and a second electrode of the third switching transistor is connected to the second node.

6. The pixel circuit according to claim 5, wherein the light emitting control module comprises a fifth switching transistor;
a gate of the fifth switching transistor is connected to the light emitting signal terminal, a first electrode of the fifth switching transistor is connected to the second level signal terminal, and a second electrode of the fifth switching transistor is connected to the first electrode of the third switching transistor and the first electrode of the driving transistor.

7. The pixel circuit according to claim 1, wherein the writing control module comprises a fourth switching transistor;
a gate of the fourth switching transistor is connected to the scan signal terminal, a first electrode of the fourth switching transistor is connected to the data signal terminal, and a second electrode of the fourth switching transistor is connected to the second node.

8. The pixel circuit according to claim 1, wherein an absolute value of a difference between a first level signal inputted from the first level signal terminal and a third level signal inputted from the third level signal terminal is smaller than a turn-on voltage of the light emitting element.

9. An organic electroluminescent display panel, comprising the pixel circuit according to claim 1.

10. A display device, comprising the organic electroluminescent display panel according to claim 9.

11. The organic electroluminescent display panel according to claim 9, wherein the driving control module further comprise a first capacitor connected between the first node and the second node.

12. The organic electroluminescent display panel according to claim 11, wherein the driving control module further comprises a second capacitor;
one terminal of the second capacitor is connected to the second node and the other terminal of the second capacitor is connected to the second level signal terminal.

13. The organic electroluminescent display panel according to claim 11, wherein the resetting control module comprises a first switching transistor and a second switching transistor;
a gate of the first switching transistor is connected to the reset signal terminal, a first electrode of the first switching transistor is connected to the first level signal terminal and a first electrode of the second switching transistor, and a second electrode of the first switching transistor is connected to the first node;
a gate of the second switching transistor is connected to the reset signal terminal, and a second electrode of the second switching transistor is connected to the second electrode of the driving transistor and the input terminal of the light emitting element.

14. The organic electroluminescent display panel according to claim 11, wherein the charging control module comprises a third switching transistor;
a gate of the third switching transistor is connected to the reset signal terminal, a first electrode of the third switching transistor is connected to the first electrode of the driving transistor and the output terminal of the light emitting control module, and a second electrode of the third switching transistor is connected to the second node.

15. The organic electroluminescent display panel according to claim 14, wherein the light emitting control module comprises a fifth switching transistor;
a gate of the fifth switching transistor is connected to the light emitting signal terminal, a first electrode of the fifth switching transistor is connected to the second level signal terminal, and a second electrode of the fifth switching transistor is connected to the first electrode of the third switching transistor and the first electrode of the driving transistor.

16. The organic electroluminescent display panel according to claim 9, wherein the writing control module comprises a fourth switching transistor;
a gate of the fourth switching transistor is connected to the scan signal terminal, a first electrode of the fourth switching transistor is connected to the data signal terminal, and a second electrode of the fourth switching transistor is connected to the second node.

17. The organic electroluminescent display panel according to claim 9, wherein an absolute value of a difference between a first level signal inputted from the first level signal terminal and a third level signal inputted from the third level signal terminal is smaller than a turn-on voltage of the light emitting element.

18. A driving method for the pixel circuit according to claim 1, comprising:
in a reset period, making the resetting control module in a turned-on status under control of the reset signal terminal, applying a signal at the first level signal terminal to the first node and the light emitting element, so as to reset the first node and the light emitting element; making the charging control module in a turned-on status under control of the reset signal terminal, and making the light emitting control module in a turned-on status under control of the light emitting signal terminal, applying a signal at the second level signal terminal to the second node so as to charge the second node;

in a compensation period, making the charging control module in a turned-on status under control of the reset signal terminal, applying a signal at the second node to the first input terminal of the driving control module; making the resetting control module in a turned-on status under control of the reset signal terminal, applying the signal at the first level signal terminal to the output terminal of the driving control module, and discharging the second node by the signal at the first level signal terminal;

in a writing period, making the writing control module in a turned-on status under control of the scan signal terminal, applying a data signal at the data signal terminal to the second node so as to write the data signal at the data signal terminal to the second node; and in a light emitting period, making the light emitting control module in a turned-on status under control of the light emitting signal terminal, applying the signal at the second level signal terminal to the driving control module, and controlling the driving control module to drive the light emitting element to emit light by the signal at the second level signal terminal.

* * * * *